(12) United States Patent
Odedara et al.

(10) Patent No.: US 10,234,336 B2
(45) Date of Patent: Mar. 19, 2019

(54) RING OSCILLATORS FOR TEMPERATURE DETECTION IN WIDEBAND SUPPLY NOISE ENVIRONMENTS

(71) Applicant: SanDisk Technologies Inc., Plano, TX (US)

(72) Inventors: Bhavin Odedara, Bangalore (IN); Jayanth Mysore Thimmaiah, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 520 days.

(21) Appl. No.: 14/867,734

(22) Filed: Sep. 28, 2015

(65) Prior Publication Data

US 2017/0038264 A1 Feb. 9, 2017

(30) Foreign Application Priority Data

Aug. 6, 2015 (IN) .......................... 4097/CHE/2015

(51) Int. Cl.
*G01K 7/24* (2006.01)
*G01K 7/32* (2006.01)
*H03K 3/03* (2006.01)

(52) U.S. Cl.
CPC ............. *G01K 7/32* (2013.01); *H03K 3/0315* (2013.01)

(58) Field of Classification Search
CPC ................................ G01K 7/32; H03K 3/0315
See application file for complete search history.

(56) References Cited

U.S. PATENT DOCUMENTS

| 7,455,450 | B2* | 11/2008 | Liu | G01K 7/203 331/57 |
|---|---|---|---|---|
| 7,619,486 | B1 | 11/2009 | Lesea | |
| 7,804,372 | B2 | 9/2010 | Nakatani | |
| 2007/0081575 | A1 | 4/2007 | Liu et al. | |

OTHER PUBLICATIONS

International Search Report and Written Opinion for corresponding application No. PCT/US2016/036584 dated Aug. 16, 2016 (10 pages).

* cited by examiner

*Primary Examiner* — Natalie Huls
*Assistant Examiner* — Janice M Soto
(74) *Attorney, Agent, or Firm* — Brinks, Gilson & Lione (57) ABSTRACT

A temperature identification system may include temperature sensing circuitry and a temperature measurement module. The temperature sensing circuitry may include a ring oscillator that generates a ring oscillator output signal having a frequency that varies depending on an operating temperature on the ring oscillator. A frequency divider circuit may divide the frequency of the ring oscillator output signal such that two or more cycles of a noise component of supply voltage are averaged, which may reduce the impact that the noise has on the frequency of the ring oscillator output signal. In some embodiments, a regulator may supply a regulated voltage to the ring oscillator. The regulator may reduce the impact of the noise for low frequency components of the noise, while the frequency divider may reduce the impact for high frequency of the noise.

12 Claims, 5 Drawing Sheets

RING OSCILLATORS FOR TEMPERATURE DETECTION IN WIDEBAND SUPPLY NOISE ENVIRONMENTS

CROSS-REFERENCE TO RELATED APPLICATIONS

This application claims priority to Indian Patent Application No. 4097/CHE/2015, filed Aug. 6, 2015. The contents of Indian Patent Application No. 4097/CHE/2015 are incorporated by reference in their entirety.

BACKGROUND

A ring oscillator may include an odd number of inverters that are configured to generate an oscillating output signal that oscillates between two voltage levels. The inverters may be chained together such that the output of one of the inverters is connected to the input of another of the inverters. Under the fundamental law of oscillation, the chain of inverters may provide a loop gain higher than one and total phase shift of 180 degrees in order to generate oscillating output signal.

Ring oscillators may be used in a system where a frequency of the oscillating output signal can be used to determine a process-voltage-temperature characteristic of the system. In one example, a ring oscillator may be used as a process detector. Due to imperfections in the fabrication process, transistors of a same type that are located in different areas of a same die, or located on different dies may have different speeds. After fabrication, dies may be tested and categorized as typical, fast, or slow in order to further calibrate the dies so that their components operate at desired speeds. A frequency of the ring oscillator output signal may be used to identify a die or a particular set of transistors on the die may as being in the typical, fast, or slow category. In another example, a ring oscillator may be used as a temperature detector that detects an operating temperature of a system. An approximately linear relationship may exist between the frequency of the ring oscillator output signal and temperature. Based on the relationship, a change in the frequency may indicate a change in the temperature of the system.

In addition to temperature, the frequency of the ring oscillator output signal may also be affected by noise in a system, such as noise on a supply voltage line. The greater the amplitude of the noise, the greater that the frequency of the ring oscillator output signal may vary. If the noise amplitude is too large, then the variation of the frequency due to the noise may mask the variation of the frequency due to a change in temperature. In other words, if the noise is too large, then the ring oscillator may generate its output signal at a frequency that does not accurately reflect the operating temperature of the system. As such, it may be desirable to reduce the impact that noise has on the ring oscillator so that the ring oscillator may generate its output signal at a frequency that most accurately reflects the operating temperature of the system.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF PRESENTLY PREFERRED EMBODIMENTS

Overview

As mentioned in the background section, due to noise on a supply voltage line, a ring oscillator used for temperature detection may not generate its output signal at a frequency that accurately reflects the operating temperature of the system. In one embodiment, a temperature identification system may include a temperature measurement module and temperature sensing circuitry. The temperature sensing circuitry may include a ring oscillator circuit configured to generate a ring oscillator signal. The temperature sensing circuitry may also include a divider configured to: receive the ring oscillator signal from the ring oscillator circuit; divide a frequency of the ring oscillator signal by a divider value to generate a divider signal; and output the divider signal to the temperature measurement module. The temperature measurement module may be configured to determine an operating temperature of the ring oscillator circuit based on the divider signal.

In another embodiment, a method of identifying an operating temperature may be performed. The method may include generating, with a ring oscillator circuit, a ring oscillator signal; dividing, with a frequency divider circuit, a frequency of the ring oscillator signal by a divider value to generate a divider signal; and identifying, with a temperature measurement module, an operating temperature of the ring oscillator based on a frequency of the divider signal.

In some embodiments, a regulator may generate a regulated voltage based on a supply voltage, and output the regulated voltage to the ring oscillator circuit. The ring oscillator circuit may generate the ring oscillator signal based on the regulated voltage.

In some embodiments, the regulator may be associated with an open loop unity gain frequency, and the divider value may be based on the open loop unity gain frequency.

In some embodiments, the divider value may be based on a ratio of a frequency of the ring oscillator signal and the open loop unity gain frequency.

In some embodiments, the divider value may be based on a predetermined frequency of the ring oscillator signal, a predetermined frequency of a noise component of a supply voltage, and a predetermined number of times to average cycles of the noise component occurring at the predetermined frequency.

In some embodiments, the divider value may be in a range between 100 and 1000.

In some embodiments, the ring oscillator may be powered by a supply voltage from a host device.

In some embodiments, a peak magnitude of the noise component may be within about ten to thirty percent of a direct current (DC) level of the supply voltage.

In some embodiments, the temperature measurement module may determine the operating temperature based on a frequency of the divider signal.

In some embodiments, a chain of inverters may be powered with a regulated voltage to generate the ring oscillator signal.

In some embodiments, a chain of inverters may be powered with a supply voltage from a host device.

Other embodiments are possible, and each of the embodiments can be used alone or together in combination. Accordingly, various embodiments will now be described with reference to the attached drawings.

Exemplary Embodiments

Figure 1:
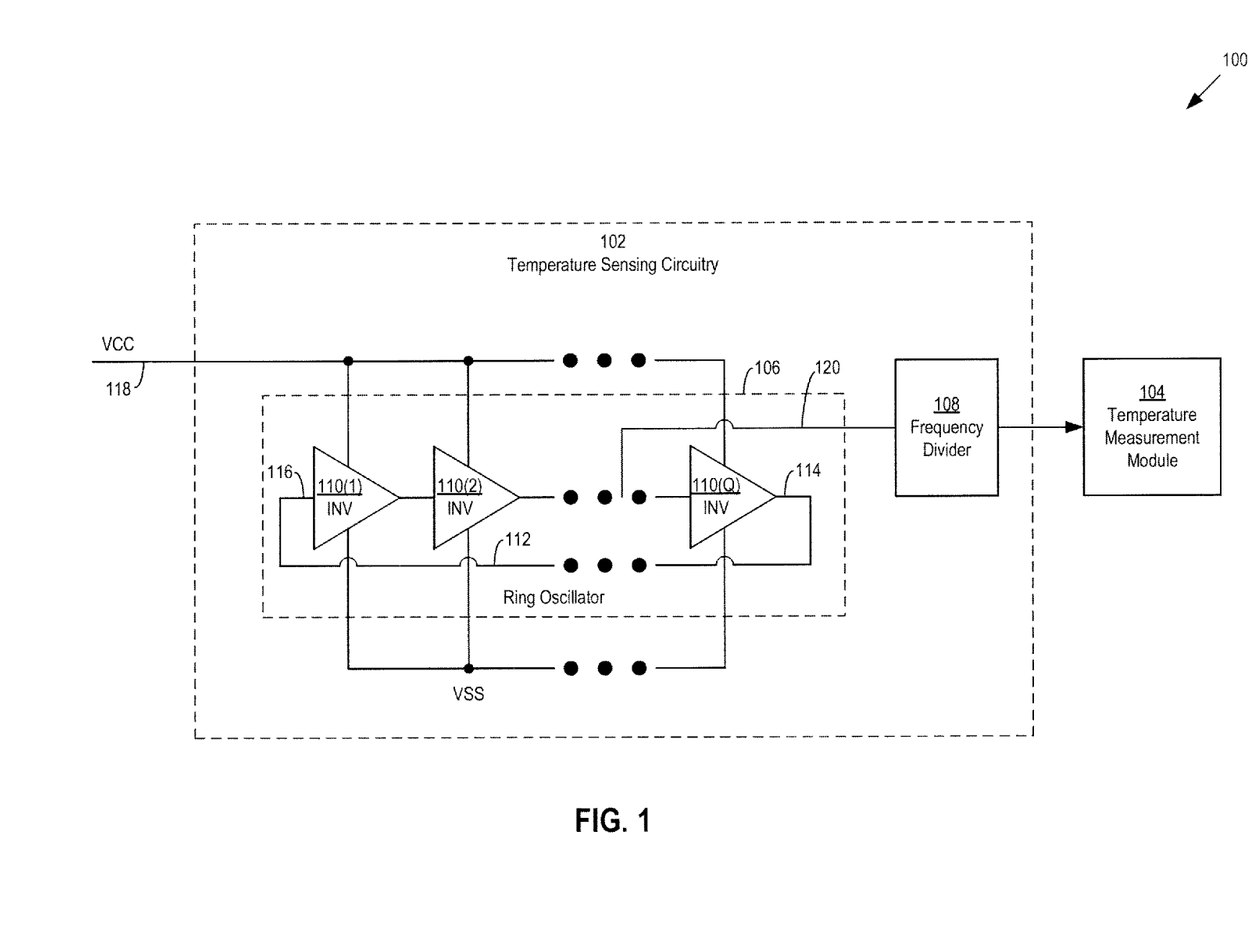
FIG. 1 is a block diagram of an example electronic temperature identification system.
Figure 2:
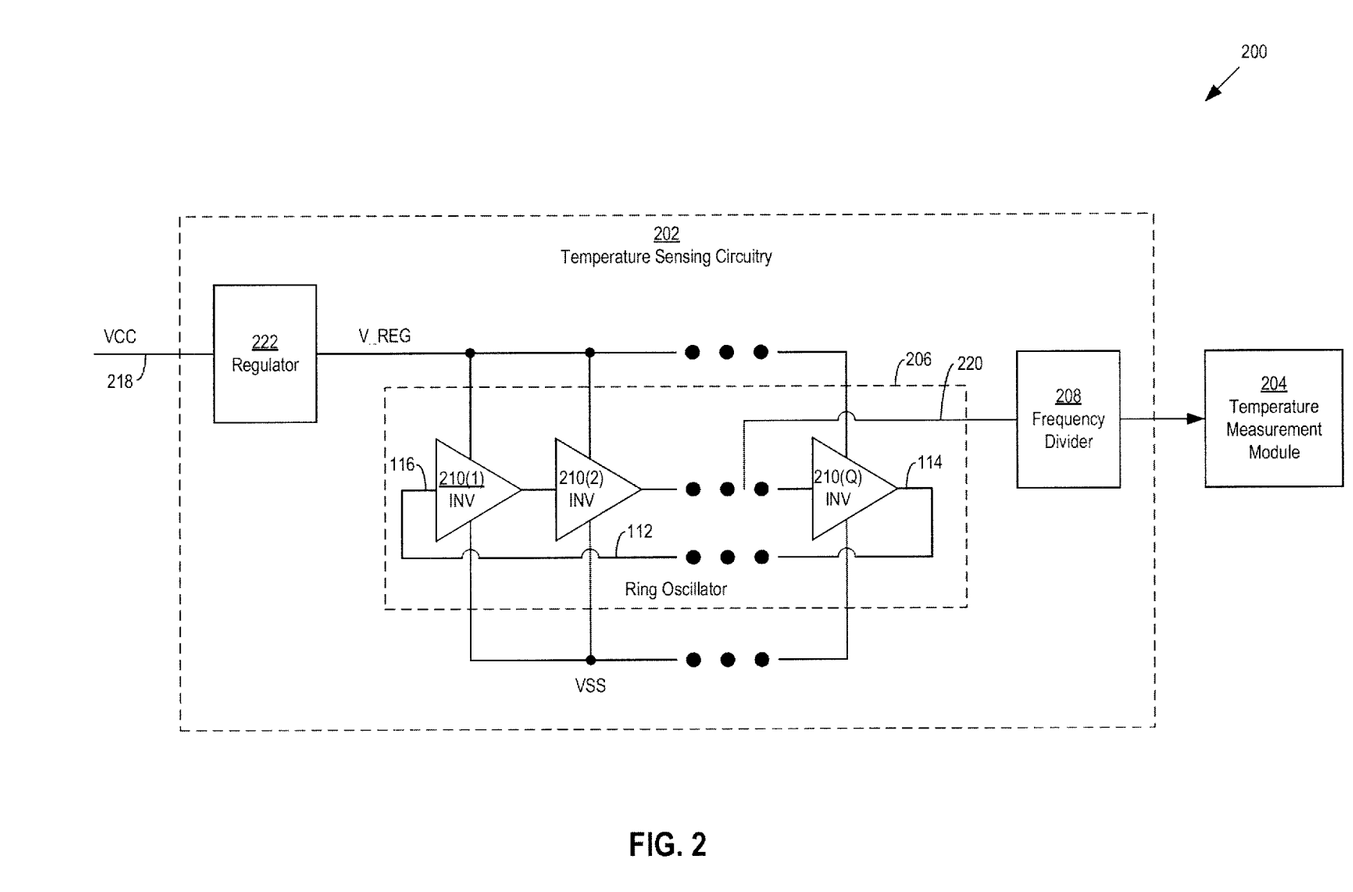
FIG. 2 is a block diagram of another example temperature identification system.
Figure 3:
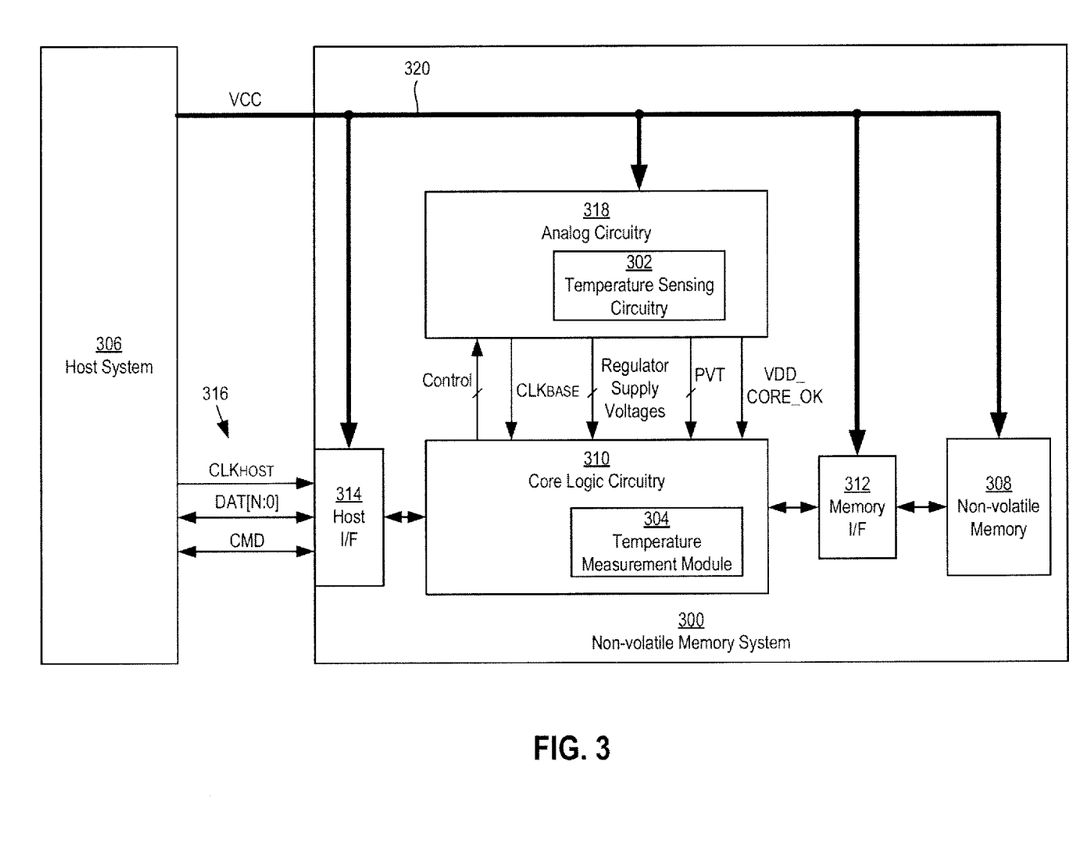
FIG. 3 is a block diagram of a non-volatile memory system in which temperature sensing circuitry of either FIG. 1 or 2 may be implemented.
Figure 4:
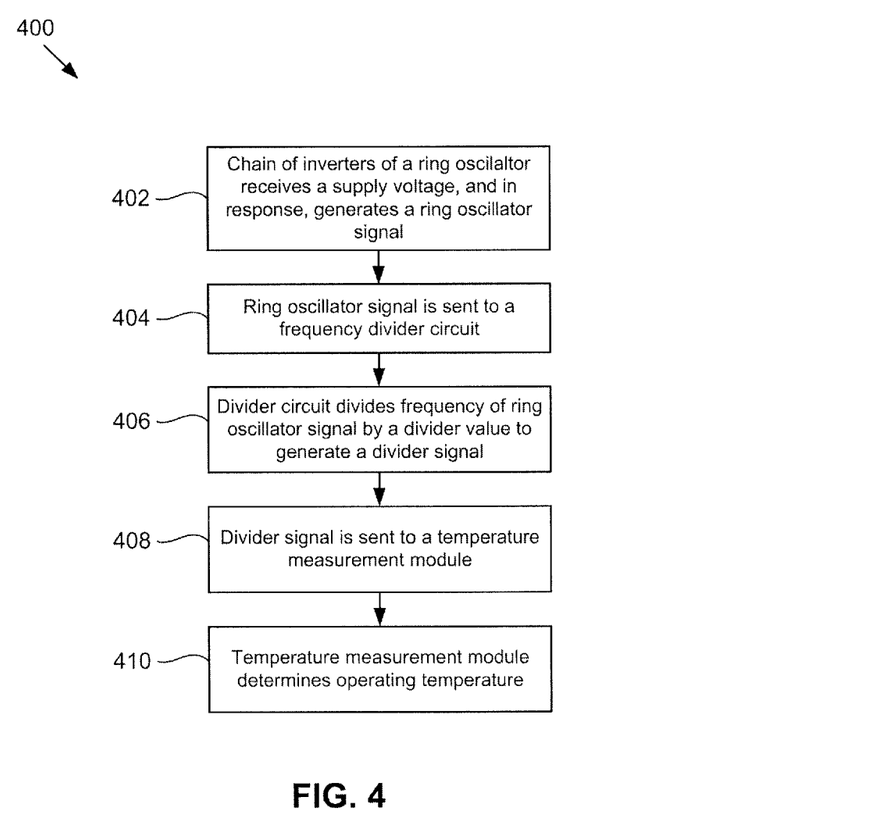
FIG. 4 is a flow chart of an example method of detecting an operating temperature of a system using a ring oscillator.
Figure 5:
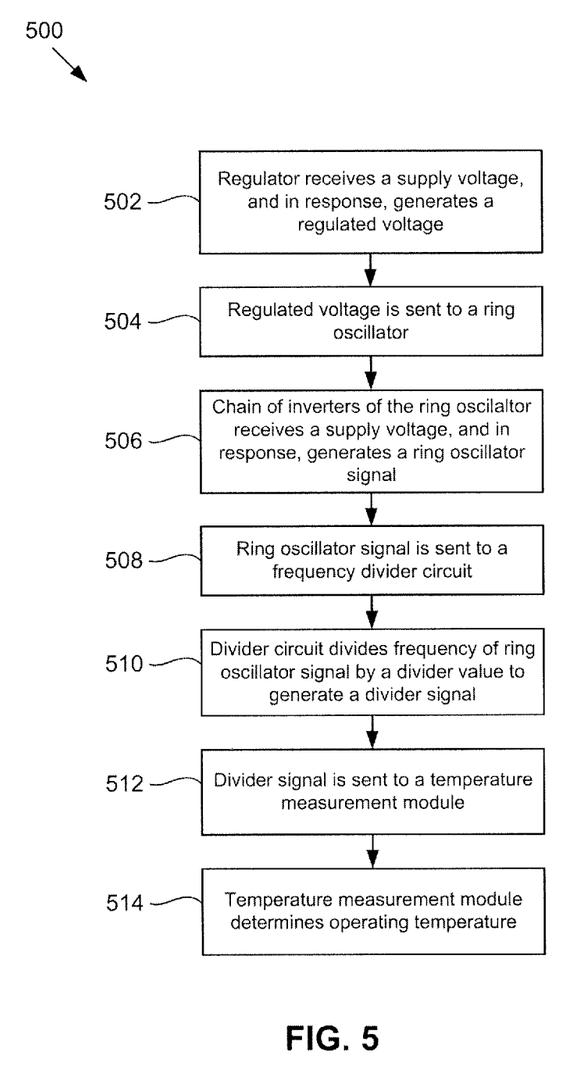
FIG. 5 is a flow chart of another example of detecting an operating temperature of a system using a ring oscillator.

As mentioned in the background section, due to noise on a supply voltage line, a ring oscillator used for temperature detection may not generate its output signal at a frequency that accurately reflects the operating temperature of the system. The following embodiments show example temperature identification systems that reduce the impact that noise on a supply voltage line may have on a frequency of a signal used to measure the operating temperature. In particular, FIGS. 1 and 2 show example temperature identification systems that sense and measure a temperature using a ring oscillator in the presence of a noisy supply voltage. FIG. 3 shows an example non-volatile memory system in which the temperature identification systems may be implemented. FIGS. 4 and 5 show example methods of detecting an operating temperature of a system using a ring oscillator.

Referring to FIG. 1, an example electronic temperature identification system 100 may include temperature sensing circuitry 102 and a temperature measurement module 104. The temperature sensing circuitry 102 may be configured to sense its temperature and/or its surrounding temperature while operating (referred to herein as its operating temperature). The temperature sensing circuitry 102 may do so by generating a signal having a frequency that is indicative of the operating temperature. The temperature measurement module 104 may be configured to receive the electrical signal from the temperature sensing circuitry 102, identify the frequency of the electrical signal, and calculate or measure the operating temperature based on the identified frequency.

The temperature sensing circuitry 102 may include a ring oscillator circuit 106 and a divider circuit 108. The ring oscillator 106 may include a chain of Q inverters (INV) 110, where Q is an odd integer of three or greater. By being chained together, the output of one of the inverters 110 may be connected to the input of another of the inverters 110. A feedback loop 112 may connect an output 114 of the last or Qth inverter 110(Q) with an input 116 of the first or initial inverter 110(1). As shown in FIG. 1, a supply line 118 may supply a supply voltage VCC to the inverters 110 to power the inverters 110. The inverters 110 may also be connected to a ground reference voltage VSS. The chain of inverters 110 may have a loop gain that is greater than one and a phase shift between the output 114 and the input 116 of 180 degrees, and as a result, may generate a ring oscillator signal having a frequency $f_{OSC}$ upon receipt of the supply voltage VCC.

The frequency $f_{OSC}$ of the ring oscillator signal may have an approximately linear relationship with the operating temperature of the ring oscillator 106. In general, as the operating temperature increases, the ring oscillator frequency $f_{OSC}$ may decrease. In some examples, the ring oscillator frequency $f_{OSC}$ may decrease 0.4 Megahertz (MHz) per 10 degrees Celsius increase in operating temperature. Due to the relationship between the operating temperature and the ring oscillator frequency $f_{OSC}$, the operating temperature may be determined by identifying the ring oscillator frequency $f_{OSC}$, and a change in the operating temperature may be determined by identifying a change in the ring oscillator frequency $f_{OSC}$.

The supply voltage VCC may be noisy—i.e., the peak level of the noise may be within a range of about 10-30 percent of the direct current (DC) level of the supply voltage VCC. As an example, a noisy supply voltage VCC having a DC level of 3.3 Volts (V) may carry a noise component that varies in a range of plus/minus 1 V. The noise may also occur over a wide range of frequencies, such as from 1 Hertz (Hz) up to 100 Megahertz (MHz) or even higher than 100 MHz, including frequencies in Gigahertz (GHz). Such noise may be referred to as wideband noise.

In addition to changing due to changes in the operating temperature, the ring oscillator frequency $f_{OSC}$ may change due to variations in the noisy supply voltage VCC. The larger the peak magnitude of the noise, the greater the ring oscillator frequency $f_{OSC}$ may vary. In the presence of a large noise component of the supply voltage VCC, a frequency value of the ring oscillator frequency $f_{OSC}$ may overlap for different operating temperatures. As a result, the ring oscillator frequency $f_{OSC}$ may not provide or reflect an accurate indication of the operating temperature since at least part of a detected variation in the ring oscillator frequency $f_{OSC}$ may be due to variations in the noise of the supply voltage VCC. As such, it may be desirable to reduce the peak magnitude of the noise, and in turn the impact the noise has on the ring oscillator frequency $f_{OSC}$, over as wide of a frequency range as possible so that the ring oscillator frequency $f_{OSC}$ may provide an accurate indication of the operating temperature despite the noise on the supply voltage line 118.

An output 120 of the ring oscillator 106 may be connected at a node connecting an output of one inverter and an input of a next inverter in the chain. Via the output 120, the ring oscillator signal may be sent to the frequency divider circuit 108, which may be configured to divide the frequency of the ring oscillator signal by a divider value N to generate a divider signal. Mathematically, the noise component of the supply voltage VCC may have an average or mean value of zero. As such, dividing the frequency of the ring oscillator signal may average cycles of the noise of the supply voltage VCC, which may absorb the impact the noise component of the supply voltage VCC has on the frequency of the divider signal generated by the frequency divider circuit 108. As a result, the divider signal may have a lower or reduced frequency variation compared to the frequency variation of the ring oscillator signal due to the noise of the supply voltage VCC. Due to the lower or reduced frequency variation, the frequency and/or changes in the frequency of the divider signal may more accurately indicate the operating temperature and/or changes in the operating temperature of the temperature sensing circuitry 102 compared to the frequency and/or frequency changes of the ring oscillator signal.

The divider value N may be chosen so that at a minimum, two cycles of the noise at a determined frequency are averaged due to the frequency division. In some example implementations, ten cycles of noise at the determined frequency are averaged. In addition or alternatively, the divider value N may be based on the ring oscillator frequency $f_{OSC}$, a determined frequency of the noise, and the number of cycles of the noise to be averaged at that determined frequency. As an example, a divider value of 500 may allow the frequency divider circuit 108 to average ten noise cycles for a ring oscillator frequency $f_{OSC}$ of 50 MHz and a noise frequency of 1 MHz. In addition or alternatively, the divider value N may be in a range of about 100 to 1,000.

The divider signal generated by the frequency divider circuit 108 may be sent to the temperature measurement module 104. Upon receipt of the divider signal, the temperature measurement module may be configured to identify the frequency of the divider signal and/or change in frequency from a prior identified frequency, and then determine an operating temperature corresponding to the identified frequency and/or a change in operating temperature corresponding to a change in frequency from the prior identified frequency. In some example configurations, the temperature measurement module 104 may include a counter module that is configured to determine the frequency of the divider signal. In some example configurations, the counter module may use an external, accurate known reference frequency, such as one generated by a host system or based on a host clock and/or one generated from a crystal module.

For some example configurations, the temperature measurement module 104 may be configured to determine the operating temperature in a predetermined number of degree increments, such as ten-degree increments for example. A frequency or a range of frequencies may correspond to each of the temperature increments. When the temperature measurement module 104 identifies a frequency of the divider signal, the temperature measurement module 104 may then determine to which of the temperature increments the identified frequency corresponds.

Despite the division, the divider signal may still have some frequency variation due to noise of the supply voltage VCC. However, the frequency variation may be small enough such that at any point in time during operation, the frequency of the divider signal does not correspond to a temperature increment other than the one that correctly indicates or corresponds to the true operating temperature of the temperature sensing circuitry.

In general, the temperature module 104 may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, the temperature measurement module 104 may include memory hardware that comprises instructions executable with a processor or processor circuitry to implement one or more of the features of the temperature measurement module 104. When the temperature measurement module 104 includes the portion of the memory that comprises instructions executable with the processor, the temperature measurement module 104 may or may not include the processor. In some examples, the temperature measurement module 104 may just be the portion of the memory that comprises instructions executable with the processor to implement the features of the corresponding module without the temperature measurement module 104 including any other hardware. Because the temperature measurement module 104 includes at least some hardware even when the included hardware comprises software, the temperature measurement module 104 may be interchangeably referred to as a hardware module.

Referring to FIG. 2, another example electronic temperature identification system 200 may include temperature measurement circuitry 202 in communication with a temperature measurement module 204. The temperature measurement module 204 may be the same and/or operate in the same way as the temperature measurement module 104 shown and described with reference to FIG. 1. In addition, similar to the temperature sensing circuitry 102 of FIG. 1, the temperature sensing circuitry 202 of FIG. 2 may include a ring oscillator 206 that includes a chain of Q inverters 210(1) to 210(Q) that generates and outputs a ring oscillator signal to a frequency divider circuit 208 via an output 220. The frequency divider circuit 208 may be the same and/or operate the same way as the frequency divider circuit 108 of FIG. 1.

However, in addition to the ring oscillator 206 and the frequency divider circuit 208, the temperature measurement circuitry 202 may further include a regulator 222 that is configured to generate a regulated voltage V_REG. As shown in FIG. 2, the regulator 222 may be configured to receive a supply voltage VCC on a supply line 218, and use the supply voltage VCC to generate the regulated voltage V_REG. The regulator 222 may be configured to generate the regulated voltage V_REG with a power supply rejection (PSR) such that the peak magnitude of the noise component of the regulated voltage V_REG is much lower than the peak magnitude of the noise component of the supply voltage VCC.

The regulated voltage V_REG may be supplied to the inverters 210(1) to 210(Q) of the ring oscillator 206 to power the inverters 210(1) to 210(Q) instead of the supply voltage VCC. Because the regulated voltage V_REG has a lower noise component than the supply voltage VCC, the frequency $f_{OSC}$ of the ring oscillator signal generated by the ring oscillator 206 may be less affected by the noise of the regulated voltage V_REG than if the inverters 210(1) to 210(Q) were powered by the supply voltage VCC. As a result, the divider circuit 208 in combination with the regulator 222 may operate in conjunction with the ring oscillator 206 to generate a divider signal having a frequency that depends less on the noise of the supply voltage VCC than the frequency of the divider signal generated in FIG. 1, which is generated without the use of a regulator to power the ring oscillator 106.

It may be desirable for the regulator 222 to generate the regulated voltage V_REG with a PSR that is at or better than a threshold PSR. For purposes of the present description, the threshold PSR may be a PSR that yields a predetermined maximum acceptable peak magnitude of noise of the regulated voltage V_REG on which the ring oscillator frequency $f_{OSC}$ may depend. An example threshold PSR may be 30 decibels (dB).

The regulator 222 may be configured to generate the regulated voltage V_REG with a PSR that is at or better than the threshold PSR only up to a certain frequency. This frequency, which may be referred to as an open loop unity gain frequency $f_{unity}$, may be the frequency above which the regulator 222 generates the regulated voltage V_REG with a PSR that is worse than the threshold PSR. The regulator 222 may be configured to generate the regulated voltage V_REG with a PSR at or better than the threshold PSR for noise having a frequency that is less than the open loop unity gain frequency $f_{unity}$, and generate the regulated voltage V_REG with a PSR that is worse than the threshold PSR for noise having a frequency that is greater than the open loop unity gain frequency $f_{unity}$.

However, because noise may occur at frequencies greater than the open loop unity gain frequency $f_{unity}$, the regulator 222 alone may not be able to sufficiently or desirably reduce the impact that the noise component of the supply voltage VCC has on the ring oscillator 206 for frequencies above the open loop unity gain frequency $f_{unity}$. As such, the frequency divider circuit 208 may be included to reduce the impact for noise occurring at frequencies greater than the open loop unity gain frequency $f_{unity}$. To do so, the divider value N of the frequency divider circuit 208 may be set so that the frequency divider circuit 208 averages two or more cycles of noise occurring at the open loop unity gain frequency $f_{unity}$ or higher. For some example configurations, the divider value N may depend on the open loop unity gain frequency $f_{unity}$, and in particular on a ratio of a predetermined ring oscillator frequency $f_{OSC}$ to the open loop unity gain frequency $f_{unity}$. The predetermined ring oscillator frequency $f_{OSC}$ may correspond to a predetermined or selected operating temperature. For some example configurations, the predetermined ring oscillator $f_{OSC}$ may be a maximum one of a plurality of frequencies corresponding to a plurality of operating temperatures, where the maximum frequency corresponds to a minimum operating temperature. An example minimum operating temperature may be −40 degrees Celsius, although other minimum operating temperatures may be used. Additionally, for some example configurations, the divider value N may be greater than the ratio multiplied by a number of cycles of noise occurring at a predetermined frequency (e.g., the open loop unity gain frequency $f_{unity}$ or higher) to be averaged. With both the regulator 222 and the frequency divider circuit 208, the regulator 222 may be configured to sufficiently reduce the peak magnitude of the noise for frequencies lower than the open loop unity gain frequency $f_{unity}$, while the frequency divider circuit 208 may be configured to sufficiently reduce the peak magnitude of the noise for frequencies higher than the open loop unity gain frequency $f_{unity}$.

FIG. 3 shows a block diagram of a non-volatile memory system 300 that includes temperature sensing circuitry 302 and a temperature measurement module 304. The temperature sensing circuitry 302 may be configured as either of the temperature sensing circuitries 102 or 202 of FIG. 1 or 2, respectively. Similarly the temperature measurement module 304 may be configured as either of the temperature measurement modules 104 or 204 of FIG. 1 or 2, respectively. As shown in FIG. 3, the non-volatile memory system 300 may be configured to be connected to and/or in communication with a host system 306. The host system 306 may be any electronic system or device that is configured to communicate and/or operate with the non-volatile memory system 300.

The non-volatile memory system 300 may include non-volatile memory 308, which may include a plurality of non-volatile memory elements or cells, each configured to store one or more bits of data. The non-volatile memory elements or cells may be any suitable non-volatile memory cells, such as NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable.

The non-volatile memory system 300 may also include core logic circuitry 310 that performs memory management functions for the storage of data in the non-volatile memory 308. Example memory management functions may include, but not limited to, communicating with the host system 306, including receiving, handling, and responding to host requests or commands, such as read, write, erase, and status requests/commands received from the host system 306; formatting the non-volatile memory 308 to ensure it is operating properly; mapping out bad memory cells; allocating spare cells to be substituted for future failed cells; and transitioning the non-volatile memory system 300 between different states, operation modes, and/or power consumption modes. In operation, when the host system 306 needs to read data from or write data to the non-volatile memory 308, it may communicate with the core logic circuitry 310.

In addition, the eMMC system 104 may include a memory interface (I/F) 312 that provides an interface between the core logic circuitry 310 and the non-volatile memory 308. The core logic circuitry 310 may be configured to communicate data and commands with the non-volatile memory 308 via the memory interface 312 to store data in and/or read data from the non-volatile memory 308. The non-volatile memory system 300 may also include a host interface 314 to communicate with the host system 306. The host interface 314 may be coupled to a communications bus 316 on which the interface 314 sends and receives signals to and from the host system 306. The host interface 314 may include driver circuitry configured to generate the signals, such as by pulling up to a high level and pulling down to a low level voltages on the lines of the communications bus 316.

The communications bus 316 may include a host clock line $CLK_{HOST}$ on which the host system 306 may send a host clock signal to the non-volatile memory system 300; an N-number of data lines DAT[N:0] on which the host system 306 and the non-volatile memory system 300 may communicate data signals with each other; and a command line CMD on which the host system 306 and the non-volatile memory system 300 may communicate command signals and responses with each other. The data signals may include data that the host system 306 wants stored in or read from the non-volatile memory system 300. Command signals sent from the host system 306 may instruct or request that the non-volatile memory system 300 perform some action, such as perform an operation, transition into a certain state, or respond with requested information, as examples. The response signals sent from the non-volatile memory system 300 may acknowledge receipt of the command signals, indicate that the instructed/action is performed, or include the requested information, as examples. The host clock signal may set the frequency of the communications bus 316 and/or control the data flow by providing the times and/or rates at which the clock and data signals may be sampled by the non-volatile system 300.

The non-volatile memory system 300 may also include analog circuitry 318 that provides a plurality of regulator supply voltages to the core logic circuitry 310, including a core supply voltage. In addition, the analog circuitry 318 may provide a base clock signal $CLK_{BASE}$, one or more process-voltage-temperature (PVT) signals, and a core voltage stabilization signal VDD_CORE_OK indicating whether the core supply voltage is at a stable level. The core logic circuitry 108 may send one or more control signals to the analog circuitry 116 to configure, program, enable, and/or disable various components of the analog circuitry 116.

As shown in FIG. 3, the temperature sensing circuitry 302 may be part of the analog circuitry 318, and the temperature measurement module 304 may be part of the core logic circuitry 310. The divider signal generated and output by the temperature sensing circuitry 302 may be one of the PVT signals output by the analog circuitry 318 to the core logic circuitry 310. The temperature measurement module 304 may determine the frequency of the divider signal to measure the operating temperature of the temperature sensing circuitry 302, as described above with reference FIGS. 1 and 2. The operating temperature sensed by the temperature sensing circuitry 302 may also be indicative of the operating temperature of the analog circuitry 318 and/or the non-volatile memory system 300 as a whole.

The core logic circuitry 310 may use the measured temperature to control and/or adjust the operating temperature. For example, the operating temperature may correspond to and/or be affected by the frequency of the base clock $CLK_{BASE}$. The higher the frequency of the base clock $CLK_{BASE}$, the higher the operating temperature, and vice versa. Based on the temperature measured by the temperature measurement module 304, the control logic circuitry 310 may determine whether the operating temperature is at a desired level, or should be decreased or increased. Based on the determination, the core logic circuitry 310 may output one of the control signals to the analog circuitry 318 to have the analog circuitry 318 either maintain the frequency of the base clock $CLK_{BASE}$, or increase or decrease the frequency in order to achieve a desired operating temperature. For example, if the core logic circuitry 310 determines that the operating temperature is too high, the core logic circuitry 310 may output one of the control signals to the analog circuitry 318 to have the analog circuitry 318 lower the frequency of the base clock signal $CLK_{BASE}$ in order to lower the operating temperature.

As shown in FIG. 3, the host system 306 may supply a supply voltage VCC on a supply line 320 to power components of the non-volatile memory system 300, including the temperature sensing circuitry 302. Where the temperature sensing circuitry 302 is configured as the temperature sensing circuitry 102 of FIG. 1, then the supply voltage VCC may be sent to the inverters of the ring oscillator circuitry to power the ring oscillators. Alternatively, where the temperature sensing circuitry 302 is configured as the temperature sensing circuitry 202 of FIG. 2, then the supply voltage VCC may be sent to a regulator rather than to the ring oscillator.

In some example configurations, the core logic circuitry 310 may be configured to enable and disable the temperature sensing circuitry 302. One of the control signals output by the core logic circuitry 310 may be an enable signal that is used to enable and disable the temperature sensing circuitry 302. For these configurations, the first or initial inverter of the ring oscillator may include a NAND gate. One of the inputs of the NAND gate may be configured to receive the output of the last inverter, as described above. Another input of the NAND gate may be configured to receive the enable signal from the core logic circuitry.

In addition, although the temperature sensing circuitry 302 and the temperature measurement module 304 are shown as being components of the analog circuitry 318 and the core logic circuitry 310, respectively, in other example configurations, the temperature sensing circuitry 302 may be a component of the non-volatile memory system 300 that is separate from the analog circuitry 318 and/or the temperature measurement module 304 may be a component of the non-volatile memory system 300 that is separate from the core logic circuitry 310. In other configurations, at least some of the temperature measurement module 304 may be part of the analog circuitry 318. For example, as described above, the temperature measurement module 304 may include a counter module to determine the frequency the divider signal. The counter module may be implemented as part of the analog circuitry 318, and the output of the counter module may be sent to the core logic circuitry 310, where another portion of the temperature measurement module 304 may use the determined frequency to measure the temperature.

In addition or alternatively, other non-volatile memory systems may include the temperature sensing circuitry 302 but not the temperature measurement module 304. For these other memory systems, the temperature measurement module may be external to the non-volatile memory system. As examples, the temperature measurement module may be part of the host system 306 and/or part of test bench or test setup. For example, the temperature measurement module 304 may include an oscilloscope that may be configured to receive the divider signal and measure the frequency of the divider signal. In still other non-volatile memory systems, the temperature measurement module 304 may be part of the non-volatile memory system 300, and the non-volatile memory system 300 may be configured to also send the divider signal to a second temperature measurement module that is external to the non-volatile memory system. For example, the non-volatile memory system may include a test pin that an external temperature measurement module may be connected to in order to receive the divider signal. Various configurations of the temperature sensing circuitry 302 and the temperature measurement module 304 as they may be implemented with a non-volatile memory system 300 may be possible.

FIG. 4 is a flow chart of an example method 400 of detecting an operating temperature of a system using a ring oscillator. At block 402, a chain of inverters of a ring oscillator may receive and be powered by a supply voltage. In response to receiving the supply voltage, the chain of inverters may generate a ring oscillator signal having an associated frequency. At block 404, the ring oscillator signal may be sent to a frequency divider circuit.

At block 406, the frequency divider circuit may receive the ring oscillator signal and divide the frequency of the ring oscillator signal by a divider value to generate a divider signal. As explained above, the divider value may be set so that at least two cycles of noise of the supply voltage at a determined frequency is averaged. As a result, the frequency of the divider signal may be less dependent on the noise of the supply voltage than the frequency of the ring oscillator signal. At block 408, the divider signal may be sent to a temperature measurement module. At block 410, the temperature measurement module may identify the frequency of the divider signal, and in response determine an operating temperature of the ring oscillator, which may be indicative of the operating temperature of the system.

FIG. 5 is a flow chart of another example method 500 of detecting an operating temperature of a system using a ring oscillator. At block 502, a regulator may receive a supply voltage. In response to receiving the supply voltage, the regulator may generate a regulated voltage with an associated power supply rejection (PSR). The amount of PSR may vary over a range of frequencies. For example, the PSR with which the regulated voltage may be at or higher than a threshold PSR for frequencies below an open loop unity gain frequency of the regulator, and lower than the threshold PSR for frequencies above the open loop unity gain frequency. At block 504, the regulator may send the regulated voltage to a ring oscillator.

At block 506, a chain of inverters of the ring oscillator may receive and be powered by the regulated voltage. In response to receiving the supply voltage, the chain of inverters may generate a ring oscillator signal having an associated frequency. At block 508, the ring oscillator signal may be sent to a frequency divider circuit. At block 510, the frequency divider circuit may receive the ring oscillator signal and divide the frequency of the ring oscillator signal by a divider value to generate a divider signal. The divider value may be set so that at least two cycles of noise of the supply voltage at a determined frequency is averaged. In some example methods, the divider value may be based on a ratio of a frequency of the ring oscillator signal to the open loop unity gain frequency of the regulator. At block 512, the divider signal may be sent to a temperature measurement module. At block 514, the temperature measurement module may identify the frequency of the divider signal, and in response determine an operating temperature of the ring oscillator, which may be indicative of the operating temperature of the system.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A system comprising:
   a regulator configured to output a regulated voltage based on a supply voltage, the regulator comprising an associated open loop unity gain frequency;
   a temperature sensing circuitry comprising:
      a ring oscillator circuit configured to generate a ring oscillator signal in response to the regulated voltage; and
      a divider configured to:
         receive the ring oscillator signal from the ring oscillator circuit;
         divide a frequency of the ring oscillator signal by a divider value to generate a divider signal, the divider value based on the open loop unity gain frequency; and
         output the divider signal;
      a temperature measurement circuit configured to determine an operating temperature of the ring oscillator circuit based on the divider signal.

2. The system of claim 1, wherein the ring oscillator comprises a chain of inverters powered by the regulated voltage.

3. The system of claim 1, wherein the divider value is based on a ratio of a frequency of the ring oscillator signal and the open loop unity gain frequency.

4. The system of claim 1, wherein the divider value is in a range between 100 and 1000.

5. The system of claim 1, wherein the temperature measurement circuit is configured to determine the operating temperature based on a frequency of the divider signal.

6. A method comprising:
   outputting, with a regulator, a regulated voltage in response to receiving a supply voltage, the regulator comprising an associated open loop unity gain frequency;
   generating, with a ring oscillator circuit, a ring oscillator signal in response to the regulated voltage;
   dividing, with a frequency divider circuit, a frequency of the ring oscillator signal by a divider value to generate a divider signal; and
   identifying, with a temperature measurement circuit, an operating temperature of the ring oscillator based on a frequency of the divider signal.

7. The method of claim 6, wherein the ring oscillator comprises a chain of inverters, the method further comprising:
   powering the chain of inverters with the regulated voltage to generate the ring oscillator signal.

8. The method of claim 6, wherein the divider value is in a range between 100 and 1000.

9. A system comprising:
   temperature sensing circuitry comprising:
      a ring oscillator circuit configured to generate a ring oscillator signal; and
      a divider configured to:
         receive the ring oscillator signal from the ring oscillator circuit;
         divide a frequency of the ring oscillator signal by a divider value to generate a divider signal, the divider value based on a predetermined frequency of the ring oscillator signal, a predetermined frequency of a noise component of a supply voltage, and a predetermined number of times to average cycles of the noise component occurring at the predetermined frequency; and
         output the divider signal;
      a temperature measurement circuit configured to determine an operating temperature of the ring oscillator circuit based on the divider signal.

10. The system of claim 9, wherein the divider value is greater than the predetermined number of times to average cycles of the noise component multiplied by a ratio of the predetermined frequency of the ring oscillator signal to the predetermined frequency of the noise component.

11. The system of claim 9, wherein the ring oscillator is configured to be powered by the supply voltage from a host device.

12. The system of claim 11, wherein a peak magnitude of the noise component is within about ten to thirty percent of a direct current (DC) level of the supply voltage.

* * * * *